(12) United States Patent
Courtney

(10) Patent No.: US 9,059,732 B2
(45) Date of Patent: Jun. 16, 2015

(54) RESOLVER-TO-DIGITAL CONVERTER

(71) Applicant: Hamilton Sundstrand Corporation, Windsor Locks, CT (US)

(72) Inventor: Christopher J. Courtney, Janesville, WI (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 183 days.

(21) Appl. No.: 13/848,208

(22) Filed: Mar. 21, 2013

(65) Prior Publication Data

US 2015/0097709 A1  Apr. 9, 2015

(51) Int. Cl.
*H03M 1/48* (2006.01)
*H03M 1/64* (2006.01)
*H03M 3/00* (2006.01)

(52) U.S. Cl.
CPC .............. *H03M 1/645* (2013.01); *H03M 1/485* (2013.01); *H03M 3/322* (2013.01)

(58) Field of Classification Search
CPC ....... G01B 21/00; G01B 21/22; H03M 1/645; H03M 1/485; H03M 1/1225; H03M 3/322
USPC ............ 341/111, 112, 115, 116; 702/94, 145; 324/207.25
See application file for complete search history.

(56) References Cited

U.S. PATENT DOCUMENTS

| | | | | |
|---|---|---|---|---|
| 5,162,798 A * | 11/1992 | Yundt | | 341/116 |
| 5,912,638 A * | 6/1999 | Vlahu | | 341/116 |
| 6,255,794 B1 | 7/2001 | Staebler | | |
| 6,278,388 B1 * | 8/2001 | Kushihara | | 341/112 |
| 6,320,524 B1 * | 11/2001 | Takehara | | 341/116 |
| 6,323,790 B1 * | 11/2001 | Takehara | | 341/111 |
| 6,891,346 B2 | 5/2005 | Simmons et al. | | |
| 7,362,070 B2 | 4/2008 | Games et al. | | |
| 7,616,143 B1 | 11/2009 | Zhu | | |
| 7,977,936 B2 | 7/2011 | Lillestolen et al. | | |
| 8,294,396 B2 | 10/2012 | Wichowski | | |
| 2011/0090104 A1 * | 4/2011 | Sata et al. | | 341/116 |
| 2012/0010849 A1 | 1/2012 | Yamada | | |

FOREIGN PATENT DOCUMENTS

JP  2012127829  7/2012

OTHER PUBLICATIONS

Jens Onno Krah, et al., "FPGA Based Resolver to Digital Converter Using Delta-Sigma Technology," PCIM Europe 2006 Proceedings pp. 931-936.
EP Application No. 14151925.6, European Search Report dated Dec. 5, 2014, 6 pages.

* cited by examiner

*Primary Examiner* — Lam T Mai
(74) *Attorney, Agent, or Firm* — Cantor Colburn LLP

(57) ABSTRACT

According to one aspect, a resolver-to-digital converter includes a first filter configured to receive a first delta-sigma modulated resolver input. A second filter is configured to receive a second delta-sigma modulated resolver input. A summing junction is configured to output a difference between a scaled output of the first filter and a scaled output of the second filter. A controller is configured to generate a controller output based on a product of a demodulator and an output of the summing junction. An integrator is configured to generate an estimated position based on the controller output. The resolver-to-digital converter also includes a compensator configured to generate a compensated estimated position based on the controller output and a compensation offset delay adjustment.

20 Claims, 3 Drawing Sheets

US 9,059,732 B2

RESOLVER-TO-DIGITAL CONVERTER

STATEMENT OF GOVERNMENT RIGHTS

This invention was made with Government support under Contract No. FA8650-06-D-2621 awarded by the United States Air Force. The Government may therefore have certain rights in this invention.

BACKGROUND OF THE INVENTION

The subject matter disclosed herein generally relates to digital motor controls, and more particularly to a resolver-to-digital converter using a delta-sigma modulator.

A resolver can be used in a feedback control loop of a motor, such as a direct current (DC) motor. Resolvers are position sensors used in high performance motor drives for precise closed-loop control. Once accurate position is determined, known motor control algorithms can be used to adjust operation of the motor. To determine position, a decoding algorithm is used to convert analog signals generated by a resolver to a digital word representing the true position of the motor shaft. The decoding is typically performed by an expensive resolver-to-digital converter (RDC) chip. As an alternative to using the RDC chip, other conversion systems have been proposed. At low motor shaft speeds contemporary decoding algorithms may provide adequate performance. However, as operational speed of the motor increases, the effective resolution of the motor position decreases when using contemporary decoding algorithms. Insufficient effective resolution of the motor position typically results in a loss of motor control accuracy.

BRIEF DESCRIPTION OF THE INVENTION

According to one aspect, a resolver-to-digital converter is provided. The resolver-to-digital converter includes a first filter configured to receive a first delta-sigma modulated resolver input. A second filter is configured to receive a second delta-sigma modulated resolver input. A summing junction is configured to output a difference between a scaled output of the first filter and a scaled output of the second filter. A controller is configured to generate a controller output based on a product of a demodulator and an output of the summing junction. An integrator is configured to generate an estimated position based on the controller output. The resolver-to-digital converter also includes a compensator configured to generate a compensated estimated position based on the controller output and a compensation offset delay adjustment.

According to yet another aspect, a method for resolver-to-digital converter compensation is provided. The method includes filtering a first delta-sigma modulated resolver input using a first filter. A second delta-sigma modulated resolver input is filtered using a second filter. A difference between a scaled output of the first filter and a scaled output of the second filter is output at a summing junction. A controller output is generated by a controller based on a product of a demodulator and the output of the summing junction. An estimated position is generated by an integrator based on the controller output. A compensated estimated position is generated by a compensator based on the controller output and a compensation offset delay adjustment.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
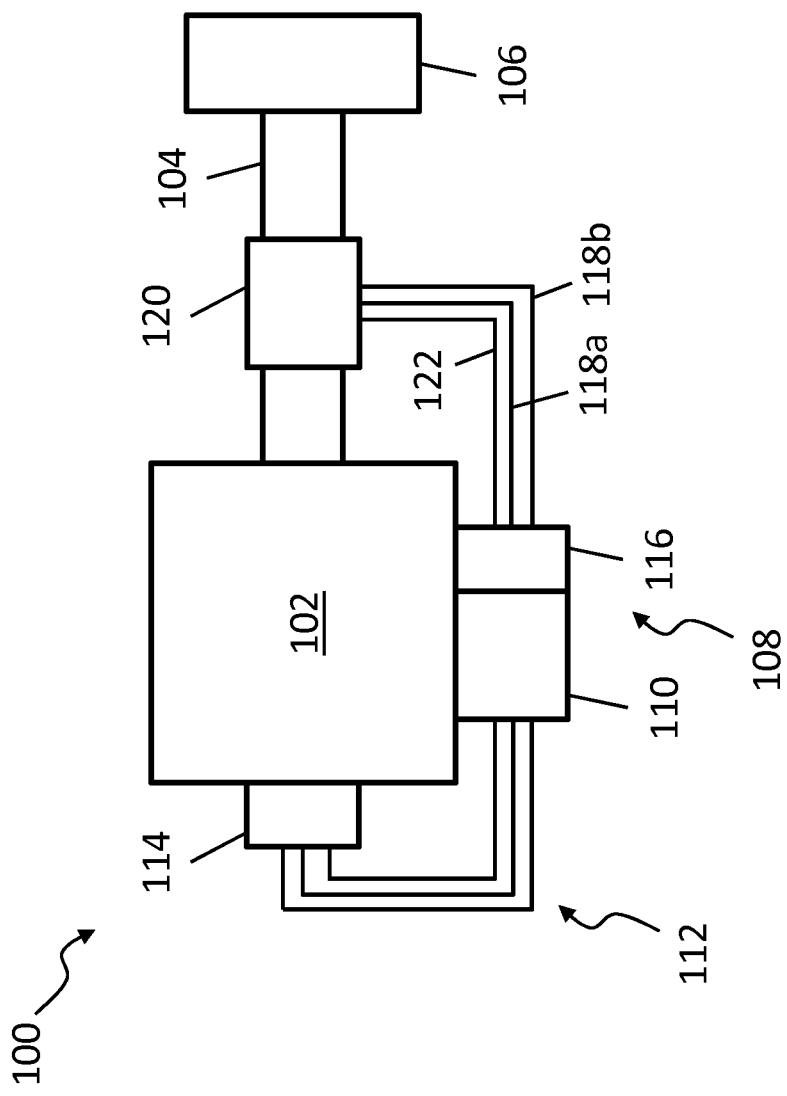
FIG. 1 is a block diagram of an exemplary embodiment of a motor control system.

FIG. 1 illustrates a block diagram of an exemplary embodiment of a motor control system 100 that includes a motor 102 with a motor shaft 104 configured to drive a load 106. A motor control 108 includes a controller 110 that drives a plurality of outputs 112 to power electronics 114. The power electronics 114 may control current at the motor 102 to set or adjust a rotational speed of the motor shaft 104. The motor control 108 also includes a resolver-to-digital converter 116 that provides position information associated with the motor shaft 104 to the controller 110. The resolver-to-digital converter 116 receives a pair of resolver inputs 118a and 118b from a resolver 120 positioned on the motor shaft 104. The resolver-to-digital converter 116 may also provide a resolver reference signal 122 to the resolver 120. The resolver reference signal 122 is an excitation signal that provides a basis for position detection using the resolver inputs 118a and 118b.

Figure 2:
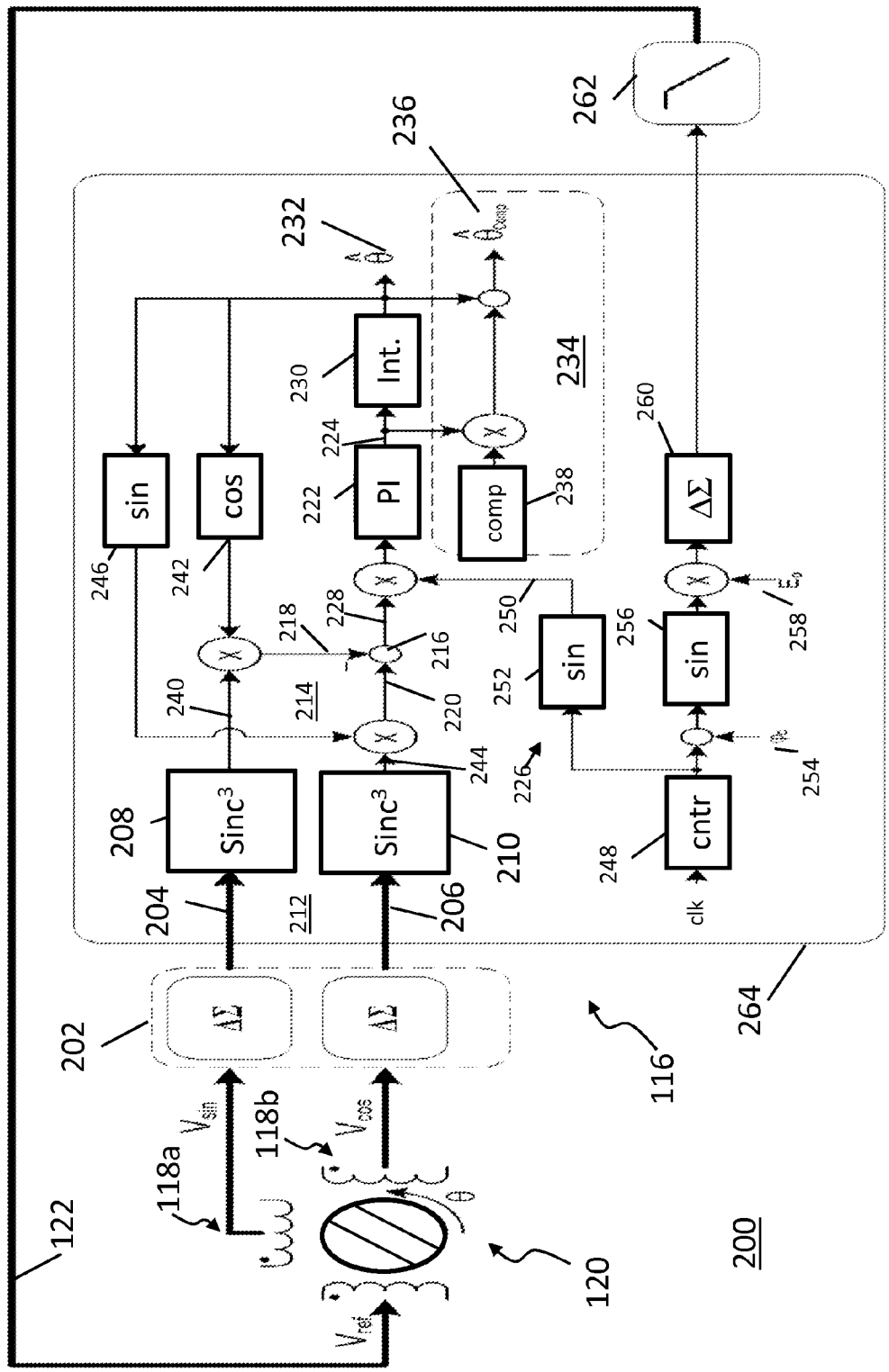
FIG. 2 depicts a block diagram of a resolver-to-digital conversion system according to an embodiment.

FIG. 2 depicts a block diagram of a resolver-to-digital conversion system 200 according to an embodiment. The resolver-to-digital conversion system 200 includes the resolver-to-digital converter 116 of FIG. 1 coupled to the resolver 120 of FIG. 1. As previously described in reference to FIG. 1, the resolver 120 receives resolver reference signal 122 which may be an analog sinusoidal signal having an excitation frequency of about 8 kHz. The resolver-to-digital converter 116 receives resolver inputs 118a and 118b from the resolver 120 at a delta-sigma modulator interface 202. In an embodiment, a first resolver input 118a provides an analog sine component of the resolver 120, and a second resolver input 118b provides an analog cosine component of the resolver 120. The delta-sigma modulator interface 202 performs analog-to-digital conversion on the pair of resolver inputs 118a and 118b to produce a first delta-sigma modulated resolver input 204 and a second delta-sigma modulated resolver input 206.

A first filter 208 is configured to receive the first delta-sigma modulated resolver input 204. A second filter 210 is configured to receive the second delta-sigma modulated resolver input 206. The first and second filters 208 and 210 may each include one or more digital filter stages, such as an infinite impulse response (IIR) filter or a finite impulse response (FIR) filter. In an exemplary embodiment, the first and second filters 208 and 210 are both sinc-cubed (Sinc$^3$) filters that provide a level of anti-aliasing and decimation of modulated signals. The structures of the first and second filters 208 and 210 both have associated delays, such as a group delay, that result in time shifting of outputs of the filters 208 and 210.

Inputs to the first and second filters 208 and 210 may reside in a different clock domain than outputs of the first and second filters 208 and 210. In an exemplary embodiment, the first and second delta-sigma modulated resolver inputs 204 and 206 are received at the first and second filters 208 and 210 in a higher frequency clock domain 212, and the first and second filters 208 and 210 produce outputs 240 and 244 in a lower frequency clock domain 214. The higher frequency clock domain 212 may be about two orders of magnitude, e.g., about 125 times, greater than the lower frequency clock domain 214.

A summing junction 216 is configured to output a difference between a scaled output 218 of the first filter 208 and a scaled output 220 of the second filter 210. A controller 222 is configured to generate a controller output 224 based on a product of a demodulation signal 250 from a modulator/demodulator 226 and an output 228 of the summing junction 216. The controller 222 may be a proportional-integral controller. An integrator 230 is configured to generate an estimated position ($\hat{\theta}$) 232 based on the controller output 224. The controller 222 and integrator 230 find and track the estimated position 232 as an estimated angle of the motor shaft 104 of FIG. 1.

A compensator 234 is configured to generate a compensated estimated position ($\hat{\theta}_{comp}$) 236 based on the controller output 224 and a compensation offset delay adjustment 238. The compensator 234 is further configured to add the estimated position 232 to a product of the compensation offset delay adjustment 238 and the controller output 224 to generate the compensated estimated position 236. The compensated estimated position 236 is an estimated motor shaft position of the motor shaft 104 in the motor control system 100 of FIG. 1. The controller 110 of FIG. 1 may use the compensated estimated position 236 rather than the estimated position 232 as a higher accuracy position estimate input for applying control algorithms known in the art.

The scaled output 218 of the first filter 208 is a product of the output 240 of the first filter 208 and a cosine function 242 of the estimated position 232. The scaled output 220 of the second filter 210 is a product of the output 244 of the second filter 210 and a sine function 246 of the estimated position 232. The output 240 of the first filter 208 represents a digitally sampled and filtered version of the first resolver input 118a. Similarly, the output 244 of the second filter 210 represents a digitally sampled and filtered version of the second resolver input 118b. Since the first resolver input 118a provides a sine component of the resolver 120 based on a motor angle (θ), the scaled output 218 provides a sin θ cos $\hat{\theta}$ term. The second resolver input 118b provides a cosine component of the resolver 120 based on the motor angle (θ), and the scaled output 220 provides a cos θ sin $\hat{\theta}$ term. Accordingly, the output 228 of the summing junction 216 can be approximated as: Δθ=sin θ cos $\hat{\theta}$−cos θ sin $\hat{\theta}$. In this example, a transformer ratio (Tr) of the resolver 120 is assumed to have a value of one for simplification. However, it will be understood that in terms of measured voltages (Vsin of the first resolver input 118a and Vcos of the second resolver input 118b), excitation voltage (Vref of the resolver reference signal 122), and the transformer ratio (Tr) of the resolver 120, the output 228 of the summing junction 216 can be approximated as:

$$\Delta\theta = \frac{V\sin\cos\hat{\theta} - V\cos\sin\hat{\theta}}{Tr\,Vref}.$$

The controller 222 operates in the lower frequency clock domain 214, and the integrator 230 operates in the higher frequency clock domain 212. The compensation offset delay adjustment 238 is based on the higher frequency clock domain 212. The compensation offset delay adjustment 238 advances the estimated position 232 a number of cycles to offset a delay of the first and second filters 208 and 210. Compensating for the delay of the first and second filters 208 and 210 before providing position information to the controller 110 of FIG. 1 can substantially improve effective bit resolution and accuracy at higher speeds. In one example, the estimated position 232 provides an effective bit resolution of about 11 bits at 6000 revolutions per minute (RPM) and about 8 bits of effective resolution at about 60,000 RPM. In contrast, using the compensation offset delay adjustment 238 to produce the compensated estimated position 236 may result in about 14 bits of effective resolution across the same speed range.

The modulator/demodulator 226 includes a counter 248 that may operate in the higher frequency clock domain 212 to produce the demodulation signal 250 based on a sine function 252. The sine function 252 may operate in the lower frequency clock domain 214. The counter 248 also produces the resolver reference signal 122 in the higher frequency clock domain 212 based on applying an optional phase offset 254, a sine function 256, and an optional gain 258 to a delta-sigma modulator 260 and a low-pass filter 262. The optional phase offset 254 and optional gain 258 allow for adjustments to the resolver reference signal 122. The low-pass filter 262 may be an analog filter to remove harmonics from the resolver reference signal 122.

In exemplary embodiments, the resolver-to-digital converter 116 is implemented primarily within a field programmable gate array (FPGA) 264. Although the FPGA 264 is depicted as a single block, it will be understood that the functionality implemented within the FPGA 264 can be distributed over multiple FPGAs. FPGAs are semiconductor devices that can be configured after manufacturing according to hardware description language (HDL) files. HDL files may be implemented in a variety of formats, such as very high-speed integrated circuit hardware description language (VHDL) and/or Verilog files. As used herein, the term "FPGA" can refer to any programmable logic device capable of performing resolver-to-digital conversion compensation.

Figure 3:
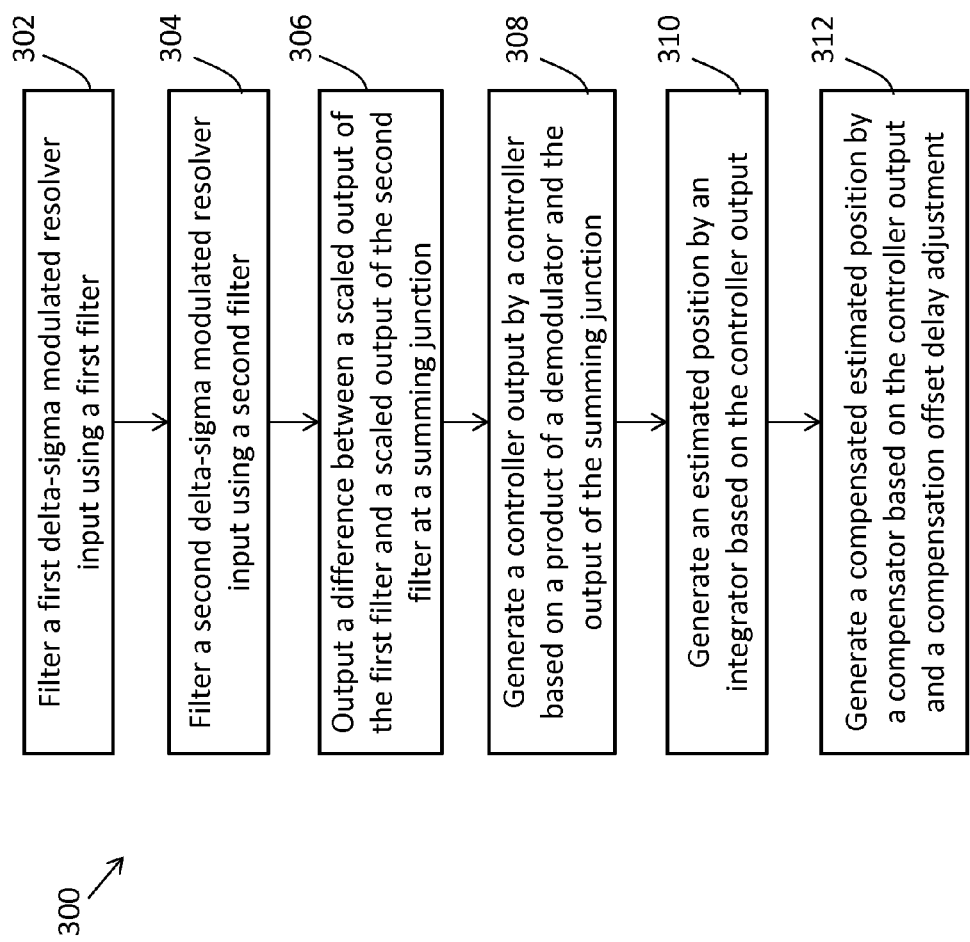
FIG. 3 depicts a process for resolver-to-digital converter compensation according to an embodiment.

FIG. 3 depicts a process 300 for providing resolver-to-digital converter compensation. The process 300 can be implemented in the resolver-to-digital conversion system 200 of FIG. 2 and is described in reference to FIGS. 1 and 2. The blocks in process 300 can be performed as parallel operations within a programmable logic device, such as FPGA 264.

At block 302, a first delta-sigma modulated resolver input 204 is filtered using a first filter 208. At block 304, a second delta-sigma modulated resolver input 206 is filtered using a second filter 210. At block 306, a difference between a scaled output 218 of the first filter 208 and a scaled output 220 of the second filter 210 is output at a summing junction 216. At block 308, a controller output 224 is generated by a controller 222 based on a product of a demodulator 226 and an output of the summing junction 216. At block 310, an estimated position 232 is generated by an integrator 230 based on the controller output 224. At block 312, a compensated estimated position 236 is generated by a compensator 234 based on the controller output 224 and a compensation offset delay adjustment 238. The estimated position 232 may be added to a product of the compensation offset delay adjustment 238 and the controller output 224 to generate the compensated estimated position 236.

As described above, embodiments of the invention may be embodied in the form of hardware or any processes and/or apparatuses for practicing the embodiments. The resolver-to-digital converter 116 may also be embodied in the form of a design structure tangibly embodied in a machine-readable medium, such as a CD-ROM, DVD, flash drive, solid-state device, hard drive, or any other computer readable storage medium. One or more HDL files and/or supporting library files stored on one or more machine-readable mediums can provide the functional structure to program one or more FPGA devices to implement the resolver-to-digital converter 116. The design structure can be encoded in one or more FPGA devices, for example, by physically modifying the internal resistance of connections in each FPGA device to establish conductive paths for electrical current to flow.

Technical effects include a providing a resolver-to-digital converter using delta-sigma modulation with delay compensation. The delay compensation increases the effective bit resolution of digital conversion as higher rotational speeds are observed by a resolver.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A resolver-to-digital converter comprising:
a first filter configured to receive a first delta-sigma modulated resolver input;
a second filter configured to receive a second delta-sigma modulated resolver input;
a summing junction configured to output a difference between a scaled output of the first filter and a scaled output of the second filter;
a controller configured to generate a controller output based on a product of a demodulator and an output of the summing junction;
an integrator configured to generate an estimated position based on the controller output; and
a compensator configured to generate a compensated estimated position based on the controller output and a compensation offset delay adjustment.

2. The resolver-to-digital converter of claim 1, wherein the compensator is further configured to add the estimated position to a product of the compensation offset delay adjustment and the controller output to generate the compensated estimated position.

3. The resolver-to-digital converter of claim 1, wherein the compensated estimated position is an estimated motor shaft position of a motor shaft in a motor control system.

4. The resolver-to-digital converter of claim 1, wherein the first delta-sigma modulated resolver input is a sine component of a resolver, and the second delta-sigma modulated resolver input is a cosine component of the resolver.

5. The resolver-to-digital converter of claim 4, wherein the scaled output of the first filter is a product of an output of the first filter and a cosine function of the estimated position, and the scaled output of the second filter is a product of an output of the second filter and a sine function of the estimated position.

6. The resolver-to-digital converter of claim 1, wherein the controller operates in a lower frequency clock domain, the integrator operates in a higher frequency clock domain, and the compensation offset delay adjustment is based on the higher frequency clock domain.

7. The resolver-to-digital converter of claim 6, wherein the higher frequency clock domain is about two orders of magnitude greater than the lower frequency clock domain.

8. The resolver-to-digital converter of claim 1, wherein the resolver-to-digital converter is implemented in a field programmable gate array.

9. The resolver-to-digital converter of claim 1, wherein the first and second filters are sinc-cubed filters, and the controller is a proportional-integral controller.

10. The resolver-to-digital converter of claim 9, wherein the compensation offset delay adjustment advances the estimated position a number of cycles to offset a delay of the sinc-cubed filters.

11. A method for resolver-to-digital converter compensation comprising:
filtering a first delta-sigma modulated resolver input using a first filter;
filtering a second delta-sigma modulated resolver input using a second filter;
outputting a difference between a scaled output of the first filter and a scaled output of the second filter at a summing junction;
generating a controller output by a controller based on a product of a demodulator and the output of the summing junction;
generating an estimated position by an integrator based on the controller output; and
generating a compensated estimated position by a compensator based on the controller output and a compensation offset delay adjustment.

12. The method of claim 11, further comprising:
adding the estimated position to a product of the compensation offset delay adjustment and the controller output to generate the compensated estimated position.

13. The method of claim 11, wherein the compensated estimated position is an estimated motor shaft position of a motor shaft in a motor control system.

14. The method of claim 11, wherein the first delta-sigma modulated resolver input is a sine component of a resolver, and the second delta-sigma modulated resolver input is a cosine component of the resolver.

15. The method of claim 14, wherein the scaled output of the first filter is a product of an output of the first filter and a cosine function of the estimated position, and the scaled output of the second filter is a product of an output of the second filter and a sine function of the estimated position.

16. The method of claim 11, wherein the controller operates in a lower frequency clock domain, the integrator operates in a higher frequency clock domain, and the compensation offset delay adjustment is based on the higher frequency clock domain.

17. The method of claim 16, wherein the higher frequency clock domain is about two orders of magnitude greater than the lower frequency clock domain.

18. The method of claim 11, wherein the compensator is implemented in a field programmable gate array.

19. The method of claim 11, wherein the first and second filters are sinc-cubed filters, and the controller is a proportional-integral controller.

20. The method of claim 19, wherein the compensation offset delay adjustment advances the estimated position a number of cycles to offset a delay of the sinc-cubed filters.

\* \* \* \* \*